(12) United States Patent
Struble et al.

(10) Patent No.: US 9,374,037 B2
(45) Date of Patent: Jun. 21, 2016

(54) VOLTAGE-CONTROLLED OSCILLATOR WITH MASK-SELECTABLE PERFORMANCE

(71) Applicant: M/A-COM Technology Solutions Holdings, Inc., Lowell, MA (US)

(72) Inventors: Wayne M. Struble, Franklin, MA (US); Eoin Carey, Cork (IE); Ronan G. Brady, Co. Cavan (IE); Shane M. Collins, Cork (IE)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 14/528,037

(22) Filed: Oct. 30, 2014

(65) Prior Publication Data

US 2016/0126889 A1    May 5, 2016

(51) Int. Cl.
*H03B 5/08*    (2006.01)
*H03B 5/24*    (2006.01)
*H01L 25/00*   (2006.01)
*H01L 25/065*  (2006.01)
*H01L 23/522*  (2006.01)

(52) U.S. Cl.
CPC .............. *H03B 5/24* (2013.01); *H01L 25/0655* (2013.01); *H01L 25/50* (2013.01); *H01L 23/5222* (2013.01); *H01L 23/5227* (2013.01)

(58) Field of Classification Search
CPC ...... H03B 5/24; H01L 25/0655; H01L 25/50; H01L 23/5222; H01L 23/5227
USPC .................................. 331/117 R, 117 FE, 167
See application file for complete search history.

(56) References Cited

U.S. PATENT DOCUMENTS

| | | | |
|---|---|---|---|
| 2003/0080819 A1 | 5/2003 | Jiles et al. | 331/176 |
| 2003/0193373 A1 | 10/2003 | McCarthy et al. | 331/100 |
| 2007/0132520 A1* | 6/2007 | Bellaouar | H03J 3/20 331/167 |
| 2011/0080226 A1 | 4/2011 | Yamakawa et al. | 331/177 V |
| 2013/0020675 A1* | 1/2013 | Kireev | H01L 25/16 257/531 |
| 2013/0336082 A1* | 12/2013 | Khawshe | G11C 5/005 365/233.12 |

FOREIGN PATENT DOCUMENTS

EP    0823777 A1    11/1998    ............... H03B 5/18

* cited by examiner

*Primary Examiner* — Richard Tan
(74) *Attorney, Agent, or Firm* — Christopher P. Maiorana, PC (57) ABSTRACT

An apparatus having a substrate with an inductor, a first die and a second die is disclosed. The first die may be (i) mounted on the substrate, (ii) configured to vary a frequency of a signal in the inductor, and (iii) fabricated with multiple first masks. The second die may be (i) mounted on the substrate, (ii) configured to excite the signal, and (iii) fabricated with multiple second masks. A particular one of the first masks generally has several designs that customize the first die to several configurations respectively. A particular one of the second masks may have several designs that customize the second die to several configurations respectively. The first die, the second die and the inductor may form a voltage-controlled oscillator. A selected first design and a selected second design generally establish multiple performances of the voltage-controlled oscillator.

20 Claims, 8 Drawing Sheets

VOLTAGE-CONTROLLED OSCILLATOR WITH MASK-SELECTABLE PERFORMANCE

The present application is related to co-pending U.S. application Ser. No. 13/765,915, filed Feb. 13, 2013, which is hereby incorporated by reference in its entirety.

FIELD OF THE INVENTION

The present invention relates to laminate-based voltage-controlled oscillators generally and, more particularly, to a method and/or apparatus for implementing a voltage-controlled oscillator with mask-selectable performance.

BACKGROUND OF THE INVENTION

Conventional high-frequency radio applications having demanding phase noise specifications often specify voltage-controlled oscillator (i.e., VCO) platform solutions to address multiple application frequency bands using a number of distinct voltage-controlled oscillator products. Each product covers a smaller frequency sub-band within a given frequency band. Monolithic voltage-controlled oscillator platforms typically incur significant cost for photolithographic mask sets, with a dedicated mask set created per distinct voltage-controlled oscillator product. Thus, unique mask sets for every sub-band in each frequency band are expensive to manufacture.

It would be desirable to implement a voltage-controlled oscillator with mask-selectable performance.

SUMMARY OF THE INVENTION

The present invention concerns an apparatus having a substrate with an inductor, a first die and a second die. The first die may be (i) mounted on the substrate, (ii) configured to vary a frequency of a signal in the inductor, and (iii) fabricated with multiple first masks. The second die may be (i) mounted on the substrate, (ii) configured to excite the signal, and (iii) fabricated with multiple second masks. A particular one of the first masks generally has several designs that customize the first die to several configurations respectively. A particular one of the second masks may have several designs that customize the second die to several configurations respectively. The first die, the second die and the inductor may form a voltage-controlled oscillator. A selected first design and a selected second design generally establish multiple performances of the voltage-controlled oscillator.

The objects, features and advantages of the present invention include providing a voltage-controlled oscillator with mask-selectable performance that may (i) implement a family of varactor circuits having a set of common masks plus a unique mask per product, (ii) implement a family of amplifier circuits having a set of common masks plus a unique mask per product, (iii) implement a family of laminated substrates having a set of common masks plus a unique mask per product, (iv) reduce mask fabrication costs compared with conventional techniques and/or (v) reduce development time compared with conventional techniques.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Embodiments of the present invention generally enable a "programmable mask" approach that reduces costs of photolithographic mask sets for multiple voltage-controlled oscillator (e.g., VCO) products in a platform. The approach may facilitate the development of voltage-controlled oscillator solutions that address a variety of performance specifications and/or cost. For a laminate voltage-controlled oscillator product, two semiconductor die (or chips or integrated circuits) and a laminated substrate (or board) are involved. A single die generally implements a varactor function. Another die generally implements a negative resistance amplifier (or core) function. The "programmable mask" approach may involve realizing the two semiconductor die layouts and, optionally, the laminated substrate layout, so that the layouts are substantially unchanged across a family of multiple voltage-controlled oscillator products.

For the varactor die, essentially the same varactor device layout may be used to implement multiple varactors. A voltage-controlled capacitance of each varactor die may be mask-selectable in each embodiment. For example, a number of varactor fingers wired into a circuit may be changed from part to part. In another example, multiple capacitor values (e.g., metal-insulator-metal capacitors) may be mask programmable by connecting into and/or disconnecting from the circuit a varying number of available parallel capacitors laid out in an array. In still other embodiments, a plate area of a capacitor may be mask programmable to vary the capacitance value. Therefore, different performances among multiple products may be controlled by the presence or absence of one or more optional metal connections. The optional metal connections are generally configured to be on a single mask layer associated with a single photolithographic mask plate. Thus, from the varactor die perspective, a single mask-plate change may change one or more performance characteristics of a voltage-controlled oscillator from one product to another.

For the negative resistance amplifier die, the changes from one product to another may be realized by changing capacitance values and/or resistance (or load) values. The changes to the capacitance values and/or the resistance values may be achieved by wiring in and/or wiring out capacitor elements and/or resistor elements from available arrays. In addition, for added performance selections, a number of transistor cells wired into the circuit may be adjusted, depending on performance criteria. All of the resistor, capacitor and/or transistor wiring adjustments may be limited to a single photolithographic mask plate (e.g., a via mask layer). Hence, from the negative resistance amplifier die perspective, a single mask plate change is sufficient to change one or more performance characteristics of a voltage-controlled oscillator from one product to another.

Figure 1:
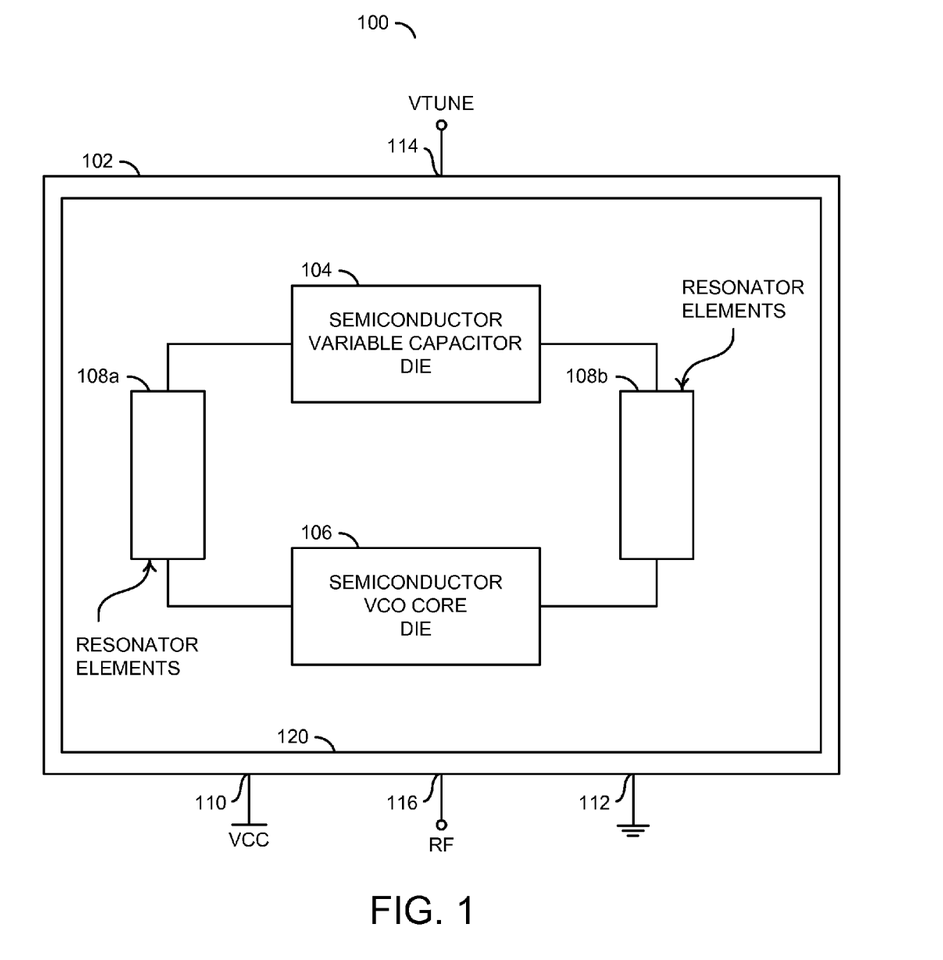
FIG. 1 is a block diagram of an apparatus.

Referring to FIG. 1, a block diagram of an apparatus 100 is shown. The apparatus (or circuit, or device, or assembly) 100 may implement a voltage-controlled oscillator based on a multilayer laminate substrate. The apparatus 100 may be based upon a high quality laminate substrate, with one or more discrete surface mount technology (e.g., SMT) devices and multiple (e.g., two) semiconductor dies (or chips or integrated circuits) bonded (e.g., flip-chip) to the laminate substrate. All of the components may be interconnected through high-Q thick metal (e.g., copper) transmission lines. Once assembled, the apparatus 100 may be fully encapsulated to provide mechanical strength and isolation from the environment.

The apparatus 100 generally comprises a block (or circuit) 102, a block (or circuit) 104 and a block (or circuit) 106. The circuit 102 may comprise one or more blocks (or circuits) 108a-108b. Interfaces (or ports) 110 and 112 may provide electrical power (e.g., VCC and ground) to the apparatus 100. An interface (or port) 114 may receive a signal (e.g., VTUNE). The signal VTUNE may convey a control voltage used to tune a frequency of oscillation in the apparatus 100. An interface (or port) 116 may present an output signal (e.g., RF). The signal RF may be an oscillating signal generated by the apparatus 100 at radio frequencies (e.g., 6 to 15 gigahertz) and have a wide oscillation bandwidth (e.g., 500 to 1400 megahertz). An encapsulation 120 may be formed over the circuits 102-108b for protection and mechanical support. The circuits 102 to 108b may be implemented in hardware and/or simulated with software.

Dimensions of the apparatus 100 generally vary with the design of the circuits 102-108b. In some embodiments, the outer dimensions of the apparatus 100 may be approximately 5 millimeters (e.g., mm) in width, 5 mm in length and 1 mm in height (as viewed from a "bottom" side of the circuit 102). Other dimensions may be implemented to meet the criteria of a particular application.

The circuit 102 generally implements a laminate substrate. The circuit 102 generally provides mechanical support for the apparatus 100. Operationally, the circuit 102 may provide electrical interconnections on multiple layers among the circuits 104-108b. The circuit 102 may also provide resonance circuitry to partially establish the frequency of oscillation of the signal RF.

The circuit 104 may implement a variable capacitance die (or chip or integrated circuit). The circuit 104 may be mounted to the circuit 102 and connected directly to the circuits 108a-108b. The circuit 104 is generally operational to control an oscillation of the signal RF in the circuits 102-108b. A frequency of the oscillation is generally varied by adjusting a voltage of the signal VTUNE in the circuit 104. The signal VTUNE generally controls one or more variable capacitance values formed in the circuit 104. In some embodiments, the circuit 104 may be fabricated in (on) a semiconductor die. The semiconductor may include, but is not limited to, silicon (e.g., Si), gallium arsenide (e.g., GaAs), and silicon germanium (e.g., SiGe) semiconductors.

The circuit 106 may implement an exciter (or negative resistance core) circuit. The circuit 106 may be mounted to the circuit 102 and connected directly to the circuits 108a-108b. The circuit 106 is generally operational to excite the signal RF to account for any power losses due to resistances, leakages and/or transmissions out of the port 116. The excite operation generally means one or more of amplifying, sustaining, building-up and/or energizing the signal RF. In some embodiments, the circuit 106 may be fabricated in (on) a semiconductor die (or chip or integrated circuit). The semiconductor may include, but is not limited to, silicon (e.g., Si), gallium arsenide (e.g., GaAs), and silicon germanium (e.g., SiGe) semiconductors. In some embodiments, the semiconductor type and/or transistor technology used in the circuit 106 may be the same as the semiconductor type and/or transistor technology used in the circuit 104. In other embodiments, the circuits 104 and 106 may be fabricated from different semiconductor materials and/or use different transistor technologies.

Each circuit 108a-108b may implement part of a resonator circuit. The circuits 108a-108b are generally operational to provide inductances, capacitances and/or delays used to establish the frequency of oscillation for the signal RF. The circuits 108a-108b may include, but are not limited to, transmission lines, inductors and capacitors. The circuits 108a-108b may be formed using one or more conductive layers of the circuit 102 and/or one or more surface mount devices (e.g., capacitors, inductors and/or resistors).

By implementing the circuits 108a-108b on the circuit 102 instead of on a semiconductor, several advantages may be realized. For example, the area of the circuits 104 and/or 106 may be reduced thereby saving costs and improving fabrication yields. The circuits 108a-108b may also have lower loss and higher Q factors than similar transmission lines fabricated on a semiconductor substrate. The lower loss and higher Q factors generally lead to lower VCO phase noise, which is often a distinguishing performance parameter. Additional details of the apparatus 100 may be found in co-pending U.S. application Ser. No. 13/765,915, filed Feb. 13, 2013, which is hereby incorporated by reference in its entirety.

Figure 2:
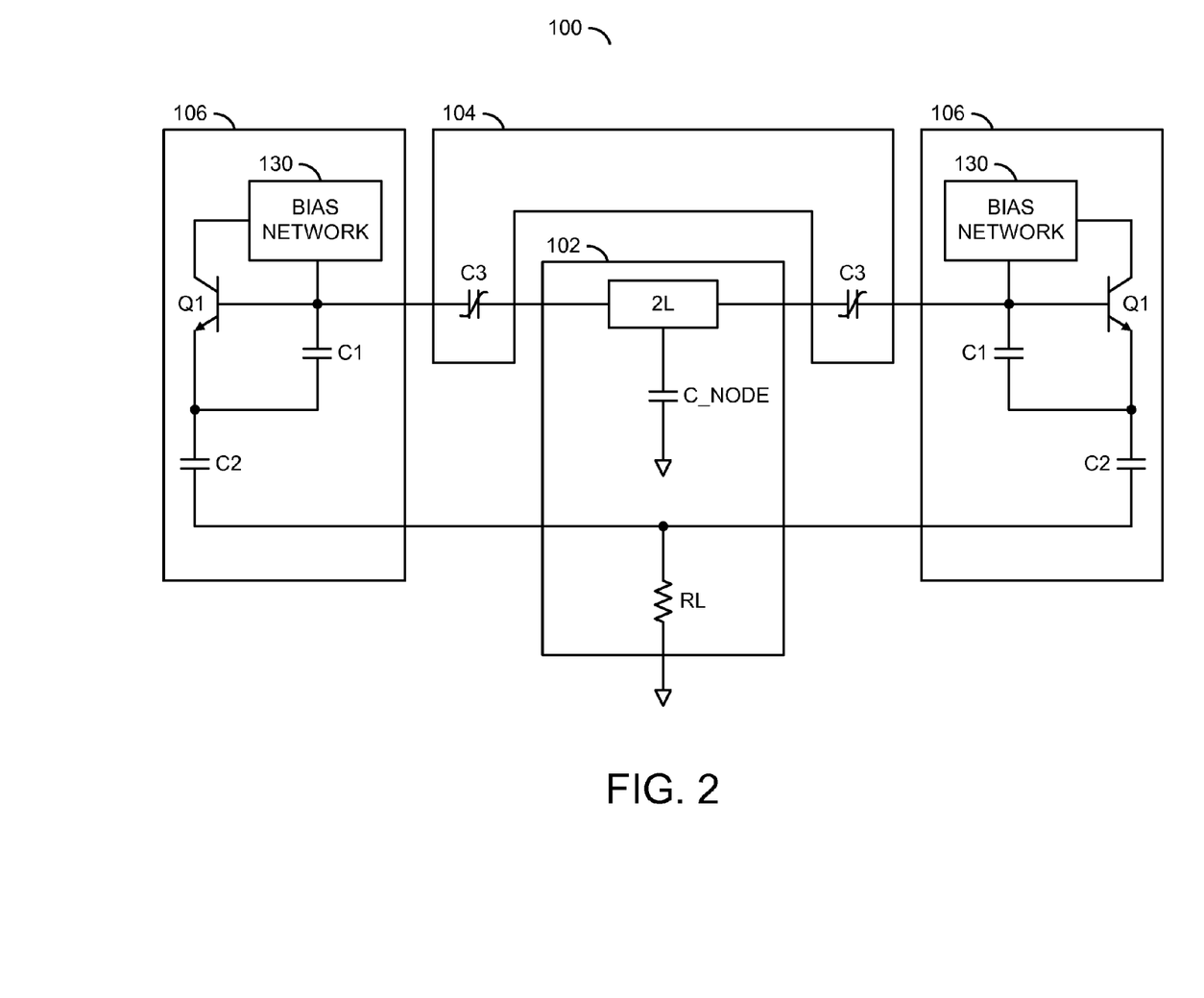
FIG. 2 is a simplified schematic of the apparatus.

Referring to FIG. 2, a simplified schematic of an example implementation of the apparatus 100 is shown. The circuit 102 generally comprises a load (or component) represented by a resistor RL, a capacitor (or component) C_NODE, and multiple inductors (or components) L. The circuit 104 generally comprises multiple capacitors (or components) C3. The circuit 106 is shown split into two halves. Each half of the circuit 106 generally comprises a bias network block (or circuit) 130, a transistor (or component) Q1, and multiple capacitors (or components) C1 and C2. The circuits 130 and components may be implemented in hardware and/or simulated with software.

A base of each transistor Q1 may be connected to a respective capacitor C3, a respective circuit 130 and a respective capacitor C1. A collector of each transistor Q1 may be connected to the respective circuit 130. An emitter of each transistor Q1 may be connected to the respective capacitor C1 and a respective capacitor C2. The capacitors C2 may also be connected to each other and the resistor RL. The capacitors C3 may be connected to a respective inductor L. The capacitor C_NODE may also be connected to each inductor L.

In some embodiments, each transistor Q1 may be implemented as a heterojunction bipolar transistor (e.g., HBT). In other embodiments, each transistor Q1 may be implemented as a bipolar junction transistor (e.g., BJT). The transistors Q1 may also implement metal-oxide-semiconductor (e.g., MOS) transistors. In some embodiments, the transistors Q1 may be implemented as pseudomorphic high electron mobility transistors (e.g., pHEMT). Other transistor technologies may be implemented to meet the criteria of a particular application.

Each capacitor C3 may implement a variable capacitance component. The capacitors C3 may have variable capacitance values that may be controlled by the signal VTUNE. In some embodiments, the capacitors C3 may be junction capacitances formed in one or more bipolar junctions (e.g., diodes). In other embodiments, the capacitor C3 may be depletion region capacitances formed in one or more MOS devices. Normal bias circuitry for the capacitors C3 may be included in the design of the circuit 104 and/or the circuit 102. Other variable capacitance structures and technologies may be implemented to meet the criteria of a particular application.

Each circuit 130 may implement a transistor bias network. The circuits 130 are generally operational to bias the corresponding transistors Q1. The circuit 130 may have one or more parameters that impact a performance of the amplification provided by the transistors Q1.

Real-time adjustments to the oscillation frequency of the apparatus 100 (e.g., a signal in the two inductors L) may be controlled by adjusting the capacitance values of the capacitors C3. Overall, a range of the oscillation frequency for the apparatus 100 is generally determined by values of the capacitors C1, the capacitors C2, the capacitors C3, and the two inductors L. A bandwidth of the oscillation is generally determined by the values of the capacitors C3 and the inductors L and the characteristics of the circuits 106. A phase noise of the oscillation may be determined by the values of the capacitors C1, the capacitors C2 the two inductors L, the capacitor C3, and the characteristics of the circuits 130. One or more harmonics of the oscillation may be determined by the value of the capacitor C_NODE.

Figure 3:
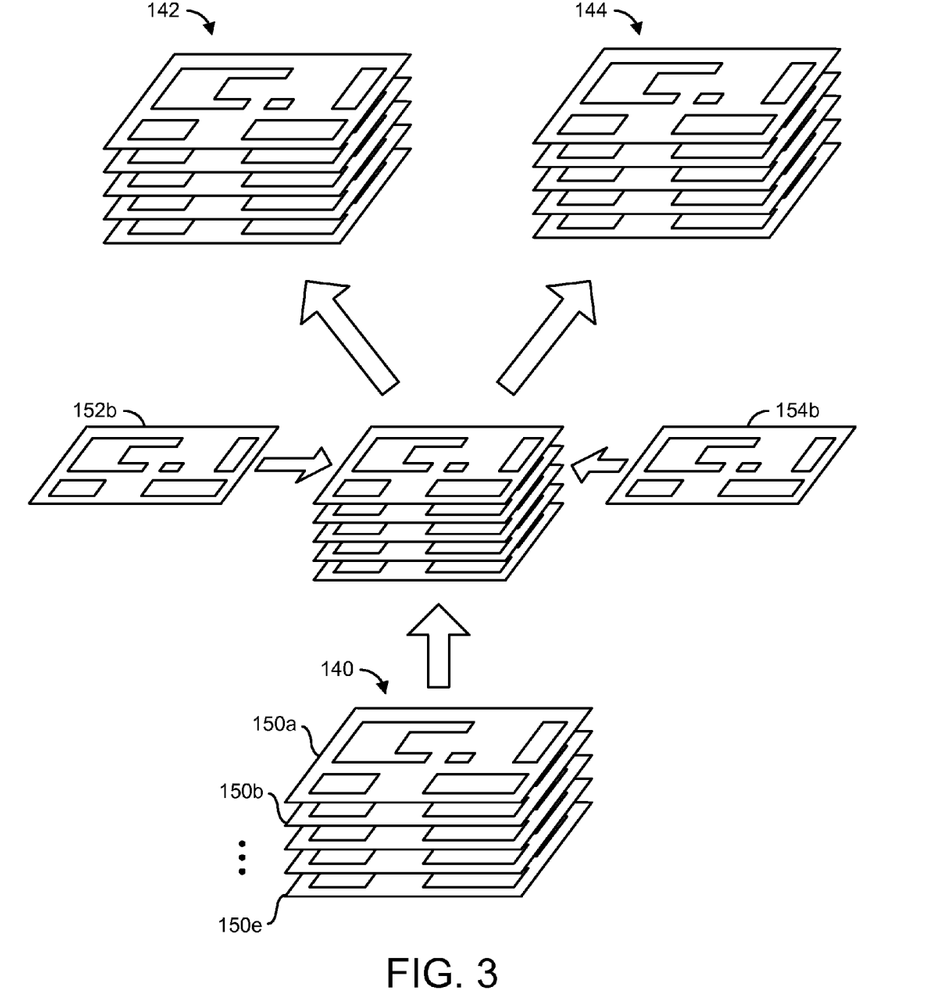
FIG. 3 is a block diagram of a set of programmable masks in accordance with a preferred embodiment of the present invention.

Referring to FIG. 3, a block diagram of a set of programmable masks 140 is shown in accordance with a preferred embodiment of the present invention. The programmable mask set 140 generally comprises multiple masks 150a-150e. The masks 150a-150e may be used during fabrication of a die (e.g., 104 or 106) or the laminate substrate 102 to generate a customized final product. Each mask 150a-150e is generally used to define a physical layout of a corresponding layer in the die/substrate. Example layers created with the masks include, but are not limited to, diffusion areas, thin gate oxide areas, gate areas, interconnections, metal traces, vias, and passivation layers. Other mask layers may be implemented to meet the criteria of a particular application.

Development of the mask set generally involves simultaneously considering all voltage-controlled oscillators in the target platform set. For example, the target platform set (or family) of voltage-controlled oscillators may include several (e.g., 19 or more) product specifications, a variety of oscillation frequencies (e.g., 6 to 15 gigahertz), a variety of oscillation bandwidths (e.g., 500 to 1400 megahertz), and/or a variety of phase noise criteria. The resulting engineering mask set 140 generally contains several design variants addressing multiple target product criteria. The engineering mask set 140 may be converted into a single-design production mask set by changing only a single mask plate (e.g., 150b) for each die and, optionally, the substrate. Variations of the particular mask 150b may be unique to each individual product within the family. For example, a production mask set 142 may be customized from the engineering mask set 140 by replacing the particular mask 150b with a different custom mask 152b. The custom mask 152b generally accounts for the specifications of the die/substrate fabricated with the production mask set 142. Likewise, a production mask set 144 may be customized from the engineering mask set 140 by replacing the particular mask 150b with a different custom mask 154b. The custom mask 154b generally accounts for the specifications of the die/substrate fabricated with the production mask set 144. The customization by replacing a single mask may be repeated for each individual die/substrate in the family.

From a wafer-fabrication material planning standpoint, the mask sets 140, 142 and 144 may provide enhanced flexibility to insert into the fabrication process alternative mask plates at a time later than a start of the fabrication run, if product-mix demand and plans change in the interim. Semiconductor technologies supporting fuse elements generally provide an alternative programmable interconnect approach. Typically, such fuses may rely on the physical destruction of circuit elements to create open connections by passing large (e.g., DC) currents. Therefore, the wiring changes may be realized by means of electronic fuse elements instead of physical changes to a photolithographic mask plate. For example, the fuse programmability may be performed at assembly or at production test (e.g., post wafer fabrication). The fuse programmability generally offers further cost benefits and flexibility benefits.

Figure 4:
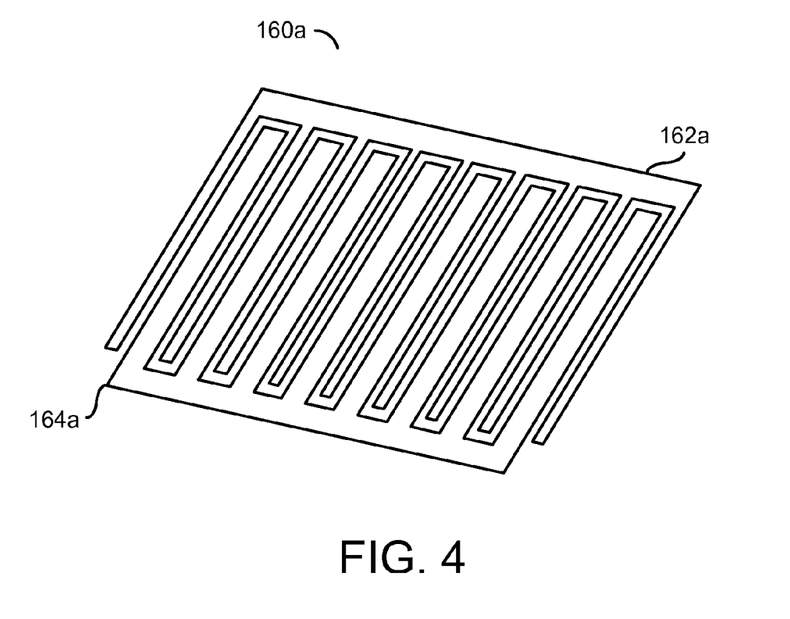
FIG. 4 is a diagram of a programmable metal layer of a voltage-variable capacitor.

Referring to FIG. 4, a diagram of an example programmable metal layer of a voltage-variable capacitor (e.g., varactor) 160a is shown. In the illustrated embodiment, multiple in/out fingers are all connected to respective common conductors 162a and 164a. The connections may be defined in a custom mask (e.g., 152b) that establishes the variable capacitance feature of the circuit 104. Utilizing all of the in/out fingers in the varactor 160a embodiment may result in a given capacitance value change in response to a given voltage change.

Figure 5:
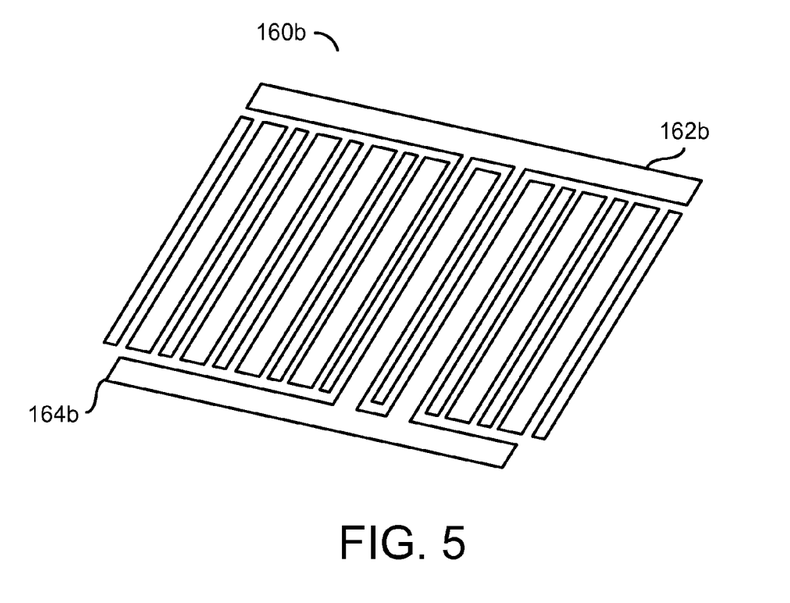
FIG. 5 is a diagram of the voltage-variable capacitor programmed differently than in FIG. 4.

Referring to FIG. 5, a diagram of another example programmable metal layer of a voltage-variable capacitor 160b is shown. The varactor 160b may be a variation of the varactor 160a programmed by a different custom mask (e.g., 154b). In the illustrated embodiment, only a few of the in/out fingers are connected to respective common conductors 162b and 164b. Utilizing a subset of the in/out fingers in the varactor 160b embodiment may result in a smaller capacitance change in response to the given voltage change than the capacitance change in the varactor 160a. Generally, the capacitance value of the varactor 160b may be smaller than the capacitance value of the varactor 160a at a particular control voltage of the signal VTUNE. In some embodiments, the approach used to program the capacitors 160a/160b may be used to program (or customize) one or more of the capacitors C3 in the circuit 104.

Figure 6:
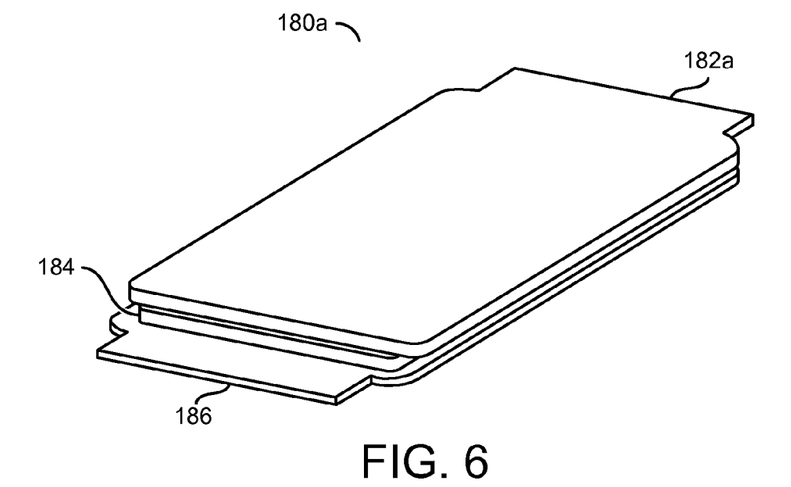
FIG. 6 is a diagram of a programmable metal layer of a capacitor.

Referring to FIG. 6, a diagram of an example programmable metal layer of a capacitor 180a is shown. The capacitor 180a generally comprises a plate formed in a metal layer 182a, an insulator layer 184, and another plate formed in a metal layer 186. The layers 182a-186 generally have a metal-insulator-metal (e.g., MIM) structure. A capacitance value of the capacitor 180a may be determined, in part, by the area of the plate in the metal layer 182a that overlaps the plate in the metal layer 186. The overlap area of the metal layer 182a is generally established by a custom mask (e.g., 152b). In some embodiments, the plates in the metal layers fully overlap to achieve a maximum capacitance value (e.g., 12 picofarad).

Figure 7:
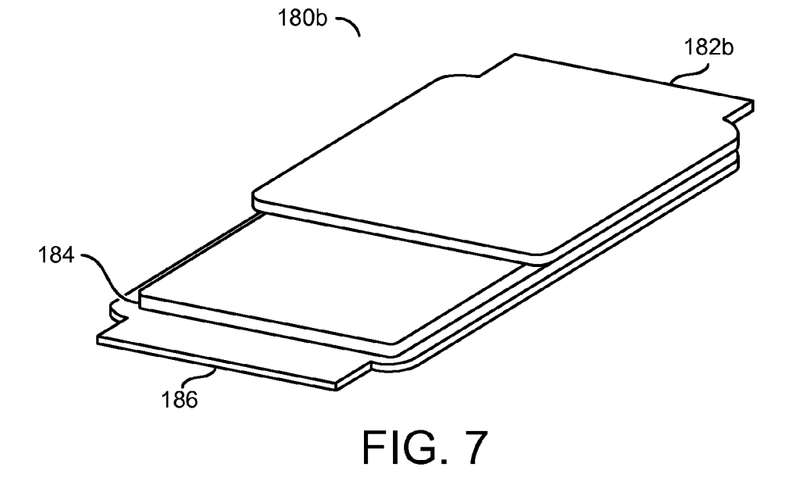
FIG. 7 is a diagram of the capacitor programmed differently than in FIG. 6.

Referring to FIG. 7, a diagram of another example programmable metal layer of a capacitor 180b is shown. The capacitor 180b may be a variation of the capacitor 180a programmed by a different custom mask (e.g., 154b). The capacitor 180b generally comprises a plate in a metal layer 182b, the insulator layer 184, and the plate in the metal layer 186. A capacitance value of the capacitor 180b may be determined, in part, by the area of the metal layer 182b that overlaps the metal layer 186. Since the overlap area in the capacitor 180b is smaller than the overlap area in the capacitor 180a, the capacitor 180b has a smaller capacitance value than the capacitor 180a. In some embodiments, the approach used to program the capacitors 180a/180b may be used to program (or customize) the capacitor C_NODE in the circuit 102 and/or other capacitors in the circuit 104.

Figure 8:
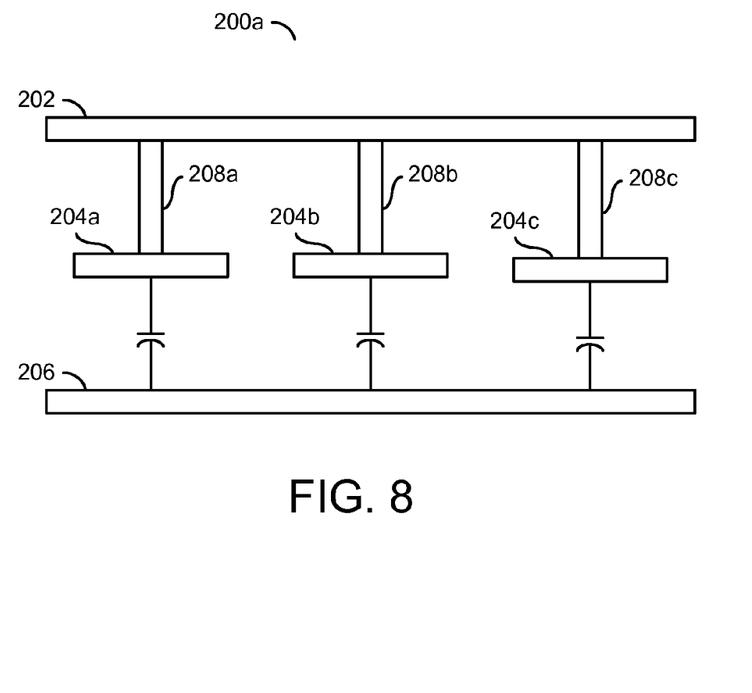
FIG. 8 is a diagram of a programmable via layer of a capacitor.

Referring to FIG. 8, a diagram of an example programmable via layer of a capacitor 200a is shown. The capacitor 200a generally comprises a top metal layer 202, multiple intermediate metal layer segments 204a-204c, and a bottom metal layer 206. Vias 208a-208c may be opened in an insulator that separates the top metal layer 202 and the intermediate metal layer segments 204a-204c. The vias 208a-208c generally allow the metal of the layer 202 to electrically contact the metal of the respective intermediate metal layer segments 204a-204c. A capacitance value of the capacitor 200a may be determined, in part, by a sum of the individual capacitance values formed between the intermediate metal layer segments 204a-204c and the bottom metal layer 206. A presence of the vias 208a-208c are generally established by a custom mask (e.g., 152b).

Figure 9:
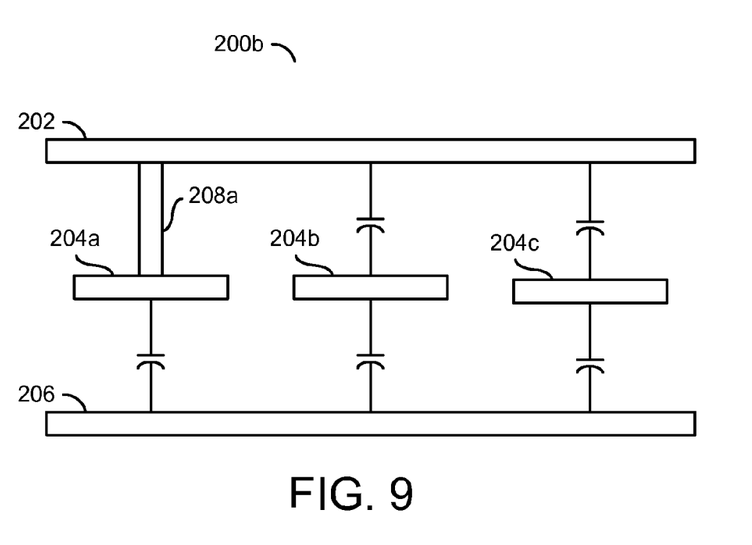
FIG. 9 is a diagram of the capacitor programmed differently than in FIG. 8.

Referring to FIG. 9, a diagram of another example programmable via layer of a capacitor 200b is shown. The capacitor 200b may be a variation of the capacitor 200a programmed by a different custom mask (e.g., 154b). In the illustrated example, the vias 208b and 208c are not formed in the capacitor 200b. Therefore, a capacitor is formed between the top metal layer 202 and the intermediate metal layer segment 204b. The formed capacitor is in series with the capacitor formed between the intermediate metal layer segment 204b and the bottom metal layer 206, thereby reducing the overall capacitance. Likewise, a capacitor is formed between the top metal layer 202 and the intermediate metal layer segment 204c. The formed capacitor is in series with the capacitor formed between the intermediate metal layer segment 204c and the bottom metal layer 206, thereby further reducing the overall capacitance. By programming the presence (208a) and absence (208b and 208c) of the vias, the custom mask may govern the fabricated capacitance value. In some embodiments, the approach used to program the capacitors 200a/200b may be used to program (or customize) the capacitors C1 and/or C2 in the circuit 106.

Figure 10:
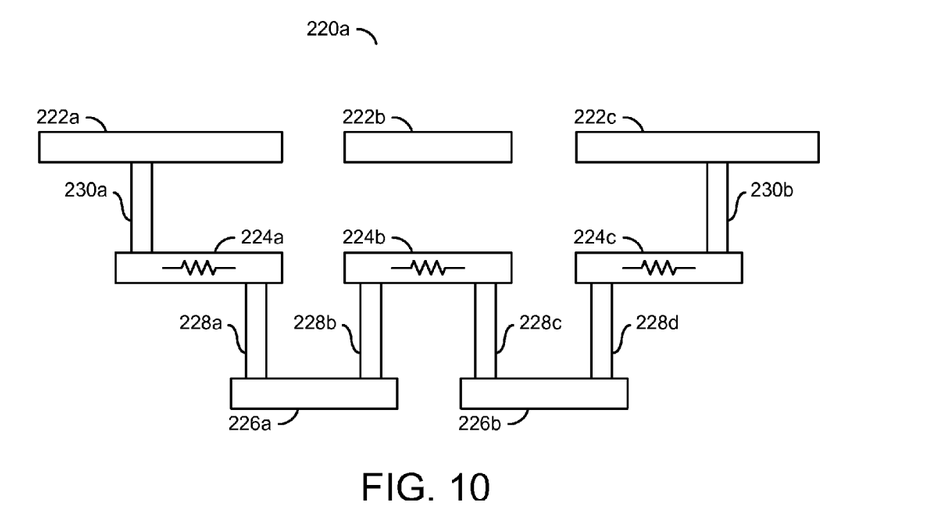
FIG. 10 is a diagram of a programmable via layer of a resistor.

Referring to FIG. 10, a diagram of an example programmable via layer of a resistor 220a is shown. The resistor 220a generally comprises multiple top metal layer segments 222a-222c, multiple resistive material layer segments 224a-224c, and multiple bottom metal layer segments 226a-226b. Vias 228a-228d may be opened in an insulator layer that separates the bottom metal layer segment 226a-226b from the intermediate resistive layer segments 224a-224c to allow the segments 224a-224c to electrically contact the segments 226a-226b. Vias 230a-230b may be opened in an insulator layer that separates the top metal layer segments 222a and 222c to allow the segments 222a and 222c to contact the resistive segments 224a and 224c, respectively. A resistance value of the resistor 220a may be determined, in part, by a sum of the individual resistance values formed in the intermediate resistive layer segments 224a-224c A presence of the vias 230a-230b are generally established by a custom mask (e.g., 152b).

Figure 11:
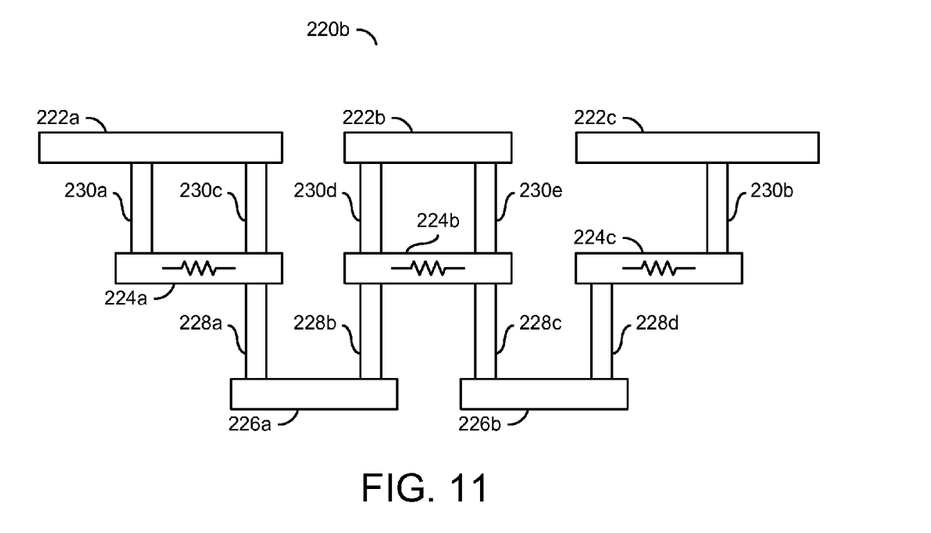
FIG. 11 is a diagram of the resistor programmed differently than in FIG. 10.

Referring to FIG. 11, a diagram of another example programmable via layer of a resistor 220b is shown. The resistor 220b may be a variation of the resistor 220a programmed by a different custom mask (e.g., 154b). In the illustrated example, additional vias 230c-230e are created by the custom mask. The vias 230a and 230c generally short the resistive layer segment 224a. The vias 230d and 230e may short the resistive layer segment 224b. Therefore, a resistance value of the resistor 220b may be determined by the resistance value of the resistive layer segment 224c. Therefore, the resistor 220b generally has a lower resistance value than the resistor 220a. In some embodiments, the approach used to program the resistors 220a/220b may be used to program (or customize) one or more resistors in the circuits 102 and/or 104.

Figure 12:
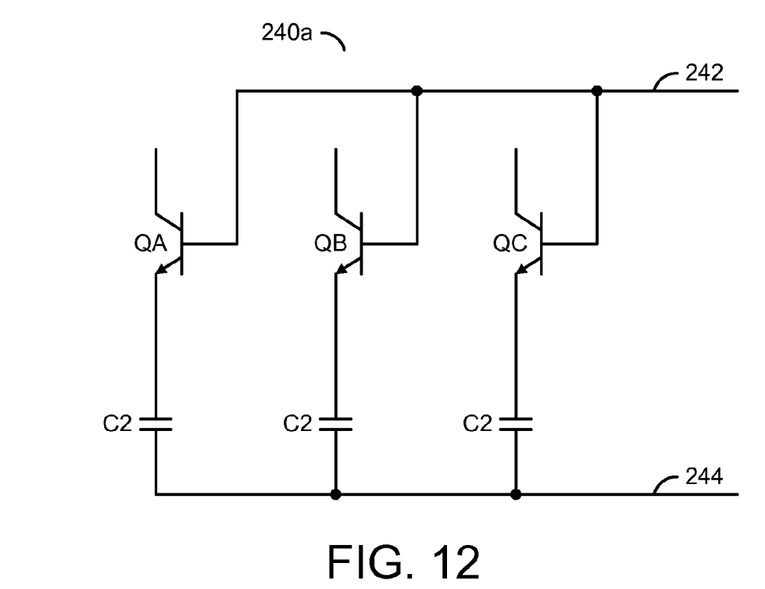
FIG. 12 is a diagram of a programmable via layer of an amplifier.

Referring to FIG. 12, a diagram of an example programmable via layer of an amplifier 240a is shown. The amplifier 240a generally comprises multiple (e.g., up to 15) transistors QA-QC and multiple capacitors C2. A base of each transistor QA-QC may be connected through a metal layer to a trace 242. Each capacitor C2 may be connected through the metal layer to a trace 244. The via layer used to connect the transistors QA-QC to the traces 242 and 244 may be established by a custom mask (e.g., 152b).

Figure 13:
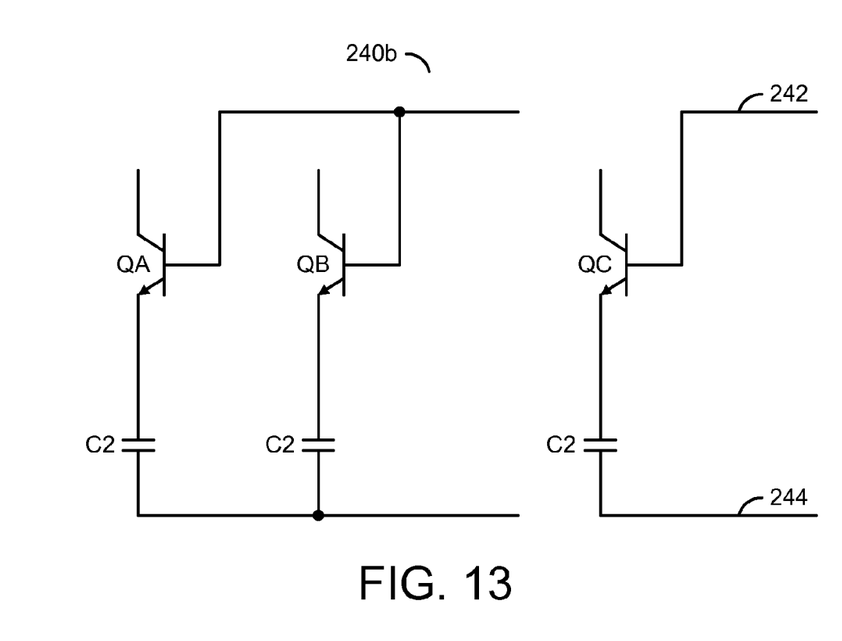
FIG. 13 is a diagram of the amplifier programmed differently than in FIG. 12.

Referring to FIG. 13, a diagram of an example programmable via layer of another amplifier 240b is shown. The amplifier 240b may be a variation of the amplifier 240a programmed by a different custom mask (e.g., 154b). The amplifier 240b may connect a single transistor (e.g., QC) and the corresponding capacitor C2 to the traces 242 and 244 using the via layer. Therefore, a performance of the amplifier 240b may be different than a performance of the amplifier 240a due to the different number of transistors QA-QC connected between the traces 242 and 244. In some embodiments, the via selected number of transistors may be used to select (or customize) the number of active transistors in the circuit 106.

The functions and structures illustrated in the diagrams of FIGS. 1-13 may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example a non-transitory storage media, and may be executed by one or more of the processors. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a substrate having an inductor;
a first die (i) mounted on said substrate, (ii) configured to vary a frequency of a signal in said inductor, and (iii) fabricated with a plurality of first masks; and
a second die (i) mounted on said substrate, (ii) configured to excite said signal, and (iii) fabricated with a plurality of second masks, wherein (a) a particular one of said first masks has a plurality of first designs that customize said first die to a plurality of first configurations respectively, (b) a particular one of said second masks has a plurality of second designs that customize said second die to a plurality of second configurations respectively, (c) said first die, said second die and said inductor form a voltage-controlled oscillator, and (d) a selected one of said first designs and a selected one of said second designs establish a plurality of performances of said voltage-controlled oscillator.

2. The apparatus according to claim 1, wherein (i) said substrate has a plurality of third masks, and (ii) a particular one of said third masks has a plurality of third designs that customize said substrate to a plurality of third configurations respectively.

3. The apparatus according to claim 2, wherein said performances comprise one or more harmonics of said signal as determined by said particular third mask.

4. The apparatus according to claim 2, wherein said performances comprise a bandwidth of said signal as determined by said particular first mask, said particular second mask, and said particular third mask.

5. The apparatus according to claim 2, wherein said performances comprise a range of said frequency of said signal as determined by said particular first mask, said particular second mask, and said particular third mask.

6. The apparatus according to claim 2, wherein said performances comprise a phase noise of said signal as determined by said particular first mask, said particular second mask, and said particular third mask.

7. The apparatus according to claim 1, wherein said first configurations of said first die have different variable capacitance values at a particular control voltage.

8. The apparatus according to claim 1, wherein said second configurations of said second die have different transistor bias networks.

9. The apparatus according to claim 1, wherein said second configurations of said second die have a different number of transistors connected to each other.

10. The apparatus according to claim 1, wherein said second mask defines one or more vias.

11. A method for creating a voltage-controlled oscillator, comprising steps of:
 (A) fabricating a first die with a plurality of first masks and a second die with a plurality of second masks;
 (B) mounting said first die and said second die on a substrate having an inductor; and
 (C) connecting said inductor to said first die and said second die such that said first die varies a frequency of a signal in said inductor and said second die excites said signal, wherein (i) a particular one of said first masks has a plurality of first designs that customize said first die to a plurality of first configurations respectively, (ii) a particular one of said second masks has a plurality of second designs that customize said second die to a plurality of second configurations respectively, (iii) said first die, said second die and said inductor form said voltage-controlled oscillator, and (iv) a selected one of said first designs and a selected one of said second designs establish a plurality of performances of said voltage-controlled oscillator.

12. The method according to claim 11, further comprising a step of:
 fabricating said substrate with a plurality of third masks, wherein a particular one of said third masks has a plurality of third designs that customize said substrate to a plurality of third configurations respectively.

13. The method according to claim 12, wherein said performances comprise one or more harmonics of said signal as determined by said particular third mask.

14. The method according to claim 12, wherein said performances comprise a bandwidth of said signal as determined by said particular first mask, said particular second mask, and said particular third mask.

15. The method according to claim 12, wherein said performances comprise a range of said frequency of said signal as determined by said particular first mask, said particular second mask, and said particular third mask.

16. The method according to claim 12, wherein said performances comprise a phase noise of said signal as determined by said particular first mask, said particular second mask, and said particular third mask.

17. The method according to claim 11, wherein said first configurations of said first die have different variable capacitance values at a particular control voltage.

18. The method according to claim 11, wherein said second configurations of said second die have different transistor bias networks.

19. The method according to claim 11, wherein said second configurations of said second die have a different number of transistors connected to each other.

20. The method according to claim 11, wherein said second mask defines one or more vias.

* * * * *